United States Patent [19]

Leuthold et al.

[11] Patent Number: 4,833,427
[45] Date of Patent: May 23, 1989

[54] SIGNAL SOURCE FOR USE WITH AN LC TANK CIRCUIT

[75] Inventors: Oskar N. Leuthold, Newport Beach; James H. Mulligan, Jr., Santa Ana, both of Calif.

[73] Assignee: Hughes Aircraft Company, Los Angeles, Calif.

[21] Appl. No.: 105,354

[22] Filed: Oct. 7, 1987

[51] Int. Cl.[4] .......................................... H03B 11/04
[52] U.S. Cl. ................................ 331/165; 331/167; 331/183
[58] Field of Search ............ 331/117 R, 117 FE, 165, 331/166, 167, 183

[56] References Cited

U.S. PATENT DOCUMENTS 4,617,534 10/1986 Lill .................................. 331/117 R Primary Examiner—Siegfried H. Grimm
Attorney, Agent, or Firm—Terje Gudmestad; Kenneth W. Float; A. W. Karambelas

[57] ABSTRACT

A signal source for generating a well-controlled, predictable oscillating output signal within a short, predetermined and constant start-up time is disclosed. The invention includes a switchable current source for selectively providing an electrical signal to a tank circuit which, in response, provides an oscillating output signal. A control circuit, comprising a comparator is connected to the tank circuit for providing a control signal to the switchable current source which causes the current source to switch in response to the output signal. Particular embodiments of the invention include means for controlling the amplitude of the oscillating output signal, means for controlling the transconductance of the current source, and means for starting the signal source.

11 Claims, 4 Drawing Sheets

(a) OSCEN
(b) A
(c) B
(d) $V_{REF2}$
(e) $V(t)$

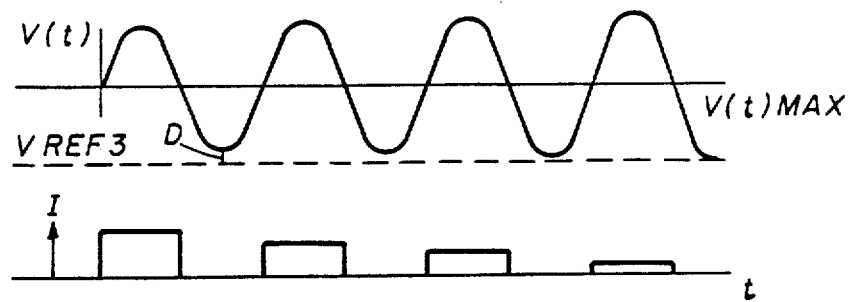
FIG. 7A
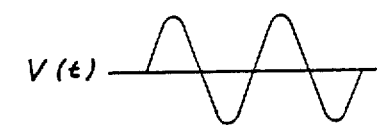
FIG. 7B
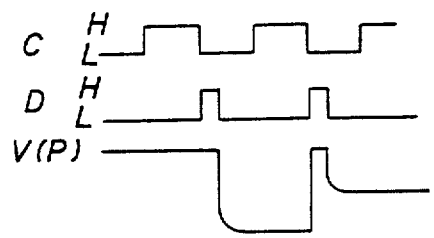
FIG. 8
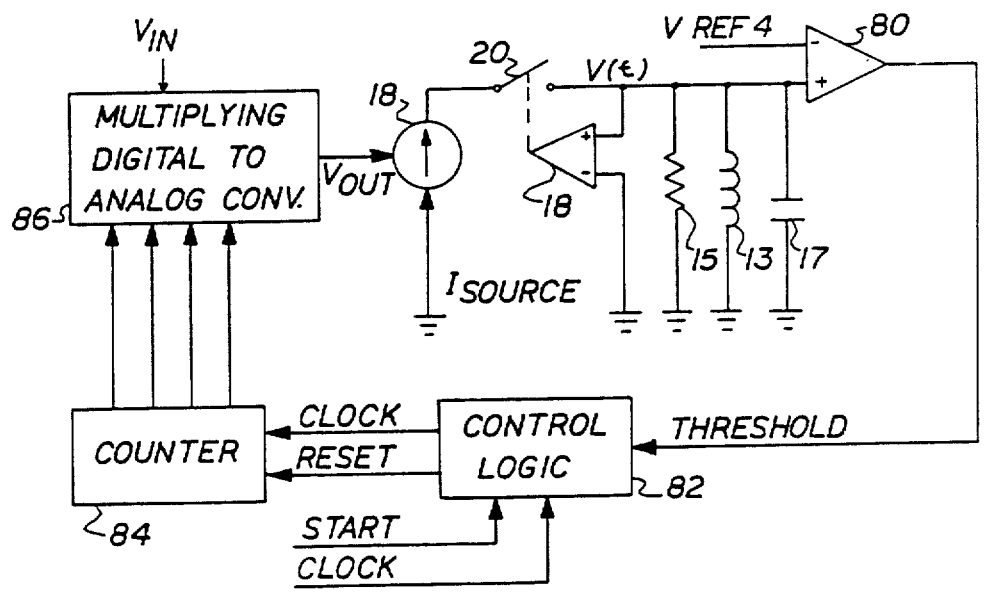

SIGNAL SOURCE FOR USE WITH AN LC TANK CIRCUIT

BACKGROUND OF THE INVENTION

1. Field of the Invention

This invention relates to signal generators. More specifically, the present invention relates to oscillator circuits employing switchable current sources which provide substantial improvement over linear feedback oscillators.

While the present invention is described herein with reference to a particular embodiment for a particular application, it is understood that the invention is not limited thereto. Those of ordinary skill in the art and access to the teachings provided herein will recognize additional modifications, applications and embodiments within the scope thereof.

2. Description of the Related Art

RLC (resistive-inductive-capacitive) tank circuits have long been used as frequency determining elements for many applications. In some applications, such as metal detection, there has been a need for a signal source which, when coupled with a tank circuit, provides a highly stable oscillation with a fast start-up time. In metal detection, for example, the movement of metal in the vicinity of the tank circuit causes a change in the inductance of the inductor and a corresponding change in the resonant oscillating frequency of the tank circuit.

Linear feedback oscillators have been used with limited success in this capacity. A linear feedback oscillator is essentially an inductive-capacitive (LC) tank circuit in parallel with a voltage controlled current source. A resistive element is provided by the internal resistance of the inductor and the current source. An amplitude detector monitors the amplitude of the output voltage of the tank circuit and feeds a signal back to a low pass or bandpass filter. The output of the low pass or bandpass filter controls the gain of the voltage-controlled current source.

Whatever the implementation, two important characteristics of such an oscillator are its start-up mechanism and its equilibrium condition. These factors are interrelated inasmuch as the transconductance of the current source must equal the reciprocal of the equivalent parallel resistance (R) of the tank circuit, current source combination to maintain a state of equilibrium. However, conventional signal sources are such that the start-up of the oscillator is a consequence of the presence of a random noise voltage. If the transconductance $g_m > 1/R$, the amplitude of the oscillation grows exponentially up to the limit of the power handling capacity of the electronic devices. Thus, for optimum performance, conventional linear feedback oscillators typically have a high $g_m$ to start and a lower $g_m$ (i.e., equal to $1/R$) to maintain equilibrium.

Unfortunately, since the random noise voltages are extremely small, the time required to reach a nominal amplitude level is usually considerable. More importantly, this time period is typically not constant and it is therefore very difficult to compensate for its variation. While the necessary time period may be reduced by providing a high $g_m$ at start-up, there is no provision in the art for overcoming the basic uncertainty in the start-up time. In addition, there are constraints on the extent to which the transconductance may be increased for start-up. Also, if the transconductance is set too high for the equilibrium condition, then amplitude clipping of the resultant output due to power supply limitations may result which may cause distortion and undesirable shifts in the frequency of oscillation.

Accordingly, there is an need in the art for a signal source which, when coupled with a tank circuit, provides a well-controlled oscillator amplitude having a predictable start-up time.

SUMMARY OF THE INVENTION

The shortcomings in the related art are addressed by the signal source of the present invention. The invention provides an accurate, stable oscillating output signal within a short, predetermined start-up time. It includes a switchable current source for selectively providing an electrical signal to a tank circuit which, in response, provides an oscillating output signal. Control means, comprising a comparator, is connected to the tank circuit for providing a control signal to the switchable current source which causes the current source to switch in response to the output signal. In particular embodiments, the invention includes means for controlling the amplitude of the oscillating output signal, means for controlling the transconductance of the current source, and means for controlling predetermined start-up behavior of the oscillation of the tank circuit.

BRIEF DESCRIPTION OF THE DRAWINGS

FIG. 7(A) shows timing diagrams illustrating the amplitude regulation scheme of FIG. 6(A).

FIG. 7(B) shows timing diagrams illustrating the operation of the particular implementation of the amplitude regulation scheme of FIG. 6(B).

FIG. 8 shows an illustrative implementation of a transconductance control circuit for augmenting the signal source of the present invention.

DETAILED DESCRIPTION

Figure 1:
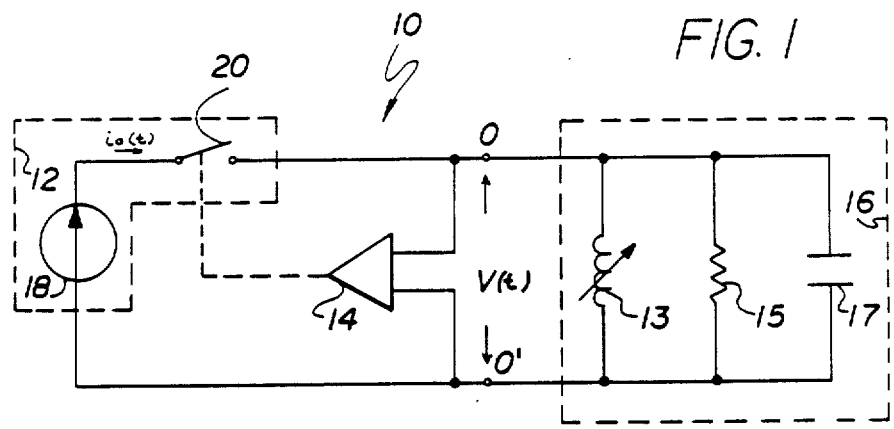
FIG. 1 is a schematic diagram of an illustrative implementation of the signal source of the present invention.

The basic signal source 10 of the present invention is shown in FIG. 1. The signal source 10 includes a switchable current source 12 and control means comprising a comparator 14, both of which are connected to a resistive, inductive, capacitive (RLC) tank circuit 16. The switchable current source 12 is implemented with a current source 18 in series with an electronic switch 20. The switch 20 operates under control of the comparator 14 and may be implemented by a transistor as is known in the art. The tank circuit 16 includes an inductor 13, equivalent parasitic resistance 15 and a capacitor 17.

The tank circuit 16 provides an oscillating output signal in response to the application of current by the current source 12. The output of the signal source is taken between the terminals O and O'.

The comparator 14 is connected in parallel with the tank circuit 16 and operates to switch in the current source 12 by closing the switch 20 during positive half cycles of the oscillating output signal. As will be evident to those skilled in the art, the comparator 14 may be made to feed back a control signal which closes the switch 20 on negative half cycles without departing from the scope of the invention. In any event, the effect is to switch the switchable current source 12 to provide current to the tank circuit 16 in response to its oscillating output signal.

Figure 2:
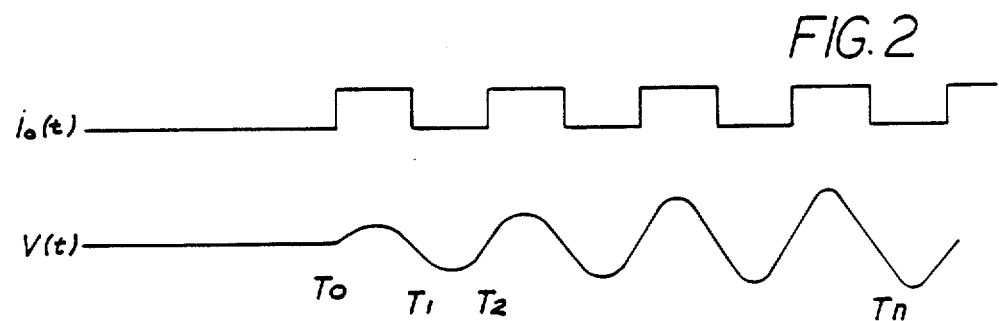
FIG. 2 shows the timing relationship between the current supplied by the switchable current source and the output voltage of the present invention and the output of the comparator of the present invention.

FIG. 2 shows the relationship between the current $i_o(t)$ supplied by the switchable current source 12 and the output voltage amplitude v(t) of the tank circuit 16. The current source 18 is switched on during the positive half cycles and switched off during the negative half cycles of the output voltage amplitude v(t). Thus, current is injected into the tank circuit 16 in resonance with the frequency of oscillation. As illustrated in FIG. 2, the amplitude of the output signal grows as a function of the injected current and the impedance of the tank circuit, from zero to a final amplitude, at which time the energy dissipated per cycle equals the energy added per cycle.

Figure 3:
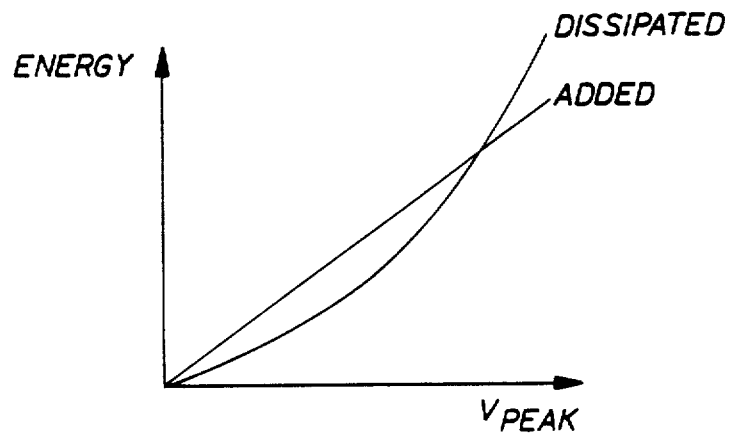
FIG. 3 illustrates the equilibrium condition of the signal source of the present invention.

In accordance with the principles of the present invention, the energy dissipated per cycle will vary with the square of the output voltage while the energy added per cycle will vary in proportion to the output voltage. As illustrated in the graphic comparison of FIG. 3, a system constructed in accordance with the present invention will therefore stabilize. The system will be in equilibrium when the energy dissipated per cycle, due to the internal resistance of the inductor 13 and the associated current source 12, equals the energy injected per cycle.

Figure 4:
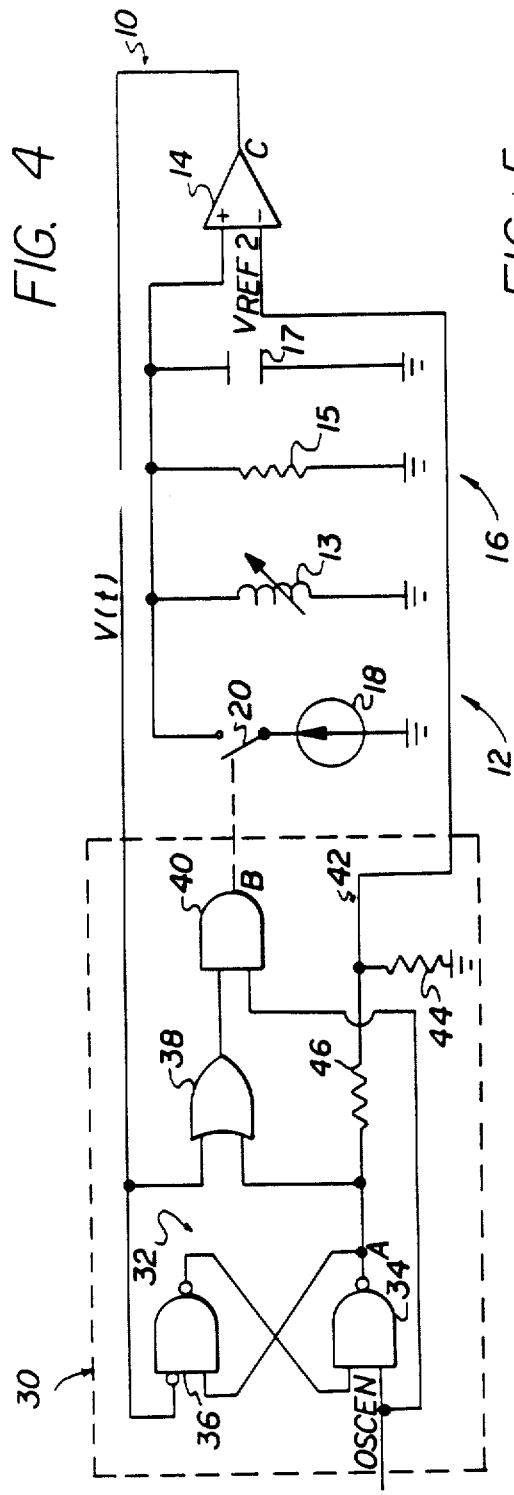
FIG. 4 shows the signal source of the present invention augmented with an illustrative start-up control circuit.

Having hereinabove disclosed a basic teaching of the present invention, reference is now made to the alternative embodiment of FIG. 4. FIG. 4 shows the signal source 10 of the invention connected to the tank circuit 16 with an illustrative start-up control circuit 30 connected between the output of the comparator 14 and the switch 20. The start-up control circuit 30 brings on the start-up of oscillation in a controlled manner. It includes a latch 32, an OR gate 38 and AND gate 40 and a resistor network 42.

The latch is implemented with two cross-coupled NAND gates 34 and 36. A first input to the first NAND gate 34 is provided by an oscillator enable signal OSCEN. This signal is also fed forward to the AND gate 40. The second input to the first NAND gate 34 is provided by the output of the second NAND gate 36 as per the cross-coupled arrangement. Likewise, a first input to the second NAND gate 36 is provided by the output of the first NAND gate 34. The second input to the second NAND gate is an inverting input and is provided by the output of the comparator 14. The invention is not limited to the scheme by which the latch 32 is implemented.

The output of the latch 32 is provided to the OR gate 38 and the resistor network 42. A second input to the OR gate 38 is acquired from the output of the comparator 14. The output of the OR gate 38 along with the oscillator enable signal provide the inputs to the AND gate 40. The output of the AND gate 40 provides the control signals for the switch 20. The resistor network 42 includes resistors 44 and 46 and sets a reference level $V_{ref}$ to which the comparator 14 compares the output voltage amplitude v(t).

Figure 5:
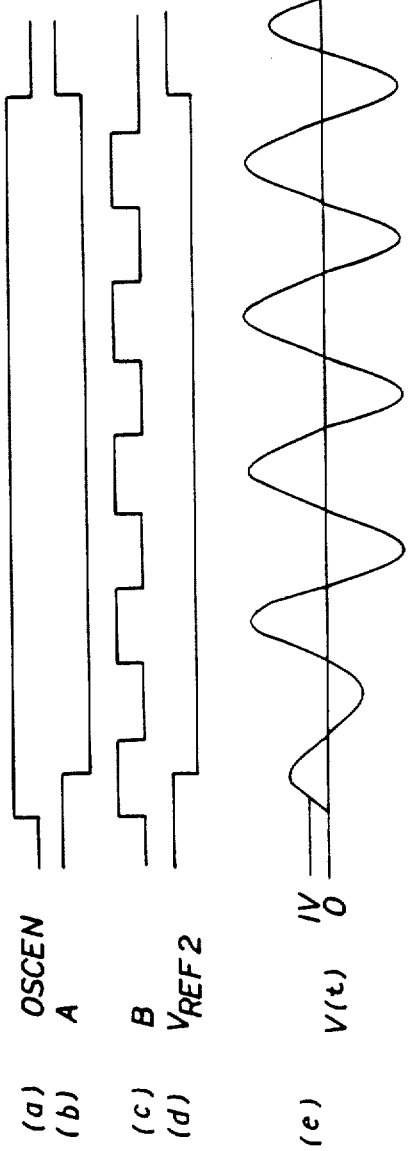
FIG. 5 shows the timing scheme for the start-up control circuit of FIG. 4.

The operation of the start-up circuit is illustrated in FIG. 5. Initially, the oscillator enable signal OSCEN is low, causing the output of the NAND gate at point A to be high and the output of the AND gate 40 at point B to be low. The switch 20 is therefore open, no current is injected into the tank circuit 16, and the output voltage amplitude v(t) is zero. When the oscillator enable signal OSCEN goes high, the high signal level at point A is provided to the AND gate 40 via the OR gate 38 on one input of the AND gate 40 and the high OSCEN signal is provided on the other input of the AND gate 40. As a result, the output of the AND gate 40 at point B is high. This closes the switch 20 and the output voltage begins to rise toward the threshold (see FIG. 5(e)) provided from the high voltage at point A as reduced by the resistor network 42. When the threshold value is reached, the output of the comparator 14 goes high causing the output of the second NAND gate 36 to go high, which in turn causes the output of the first NAND gate 34 to go low. When the voltage at point A goes low, the value of $V_{ref2}$ goes low (see FIG. 5(d)). The new threshold for the comparator 14 is therefore zero volts. Accordingly, when the output signal amplitude v(t) goes below zero volts (see FIG. 5(e)), the comparator output goes low. However, this does not change the state of the latch as point A is now low. The closure of the switch 20 is now controlled by the presence of a high output from the comparator 14 and the presence of the oscillator enable signal OSCEN at the inputs to the AND gate 40. For example, the comparator 14 switches on the switchable current source 12 during the successive positive half cycles of the output voltage amplitude v(t) so long as OSCEN is high. With this scheme, controlled start-up from zero to a predetermined level within a constant period of time is accomplished.

Figure 6A:
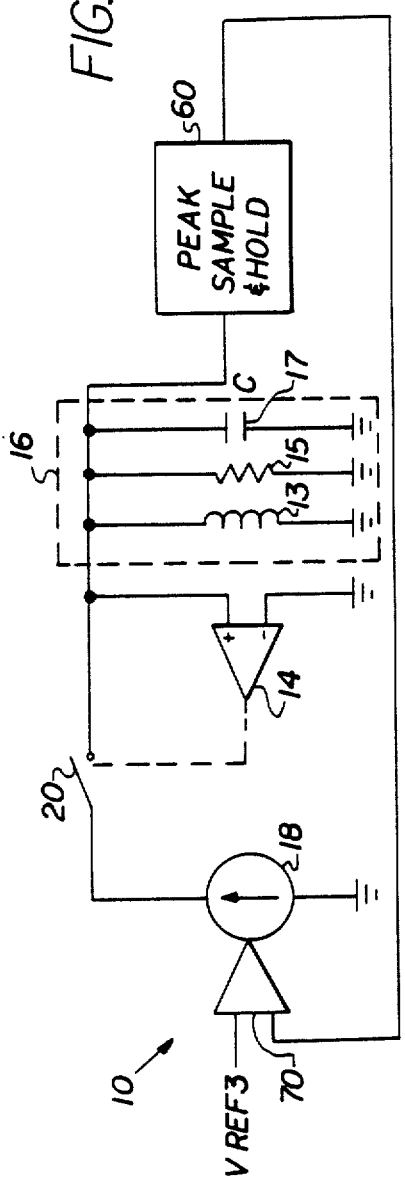
FIG. 6(A) shows the signal source of the present invention augmented with an illustrative amplitude regulation system of general design.

Now, consider that the peak output voltage amplitude $v(t)_{peak}$ is equal to $KI_oR$, where K is a constant, $I_o$ is the current provided by the current source and R is the resistive element 15 of the tank circuit 16. Since the components of the tank circuit 16 might vary in value, and since it is a primary objective to accurately control the voltage output level of the oscillator, the amplitude regulation scheme of FIG. 6(A) is provided to maintain the peak output voltage amplitude $v(t)_{peak}$ approximately constant in spite of changes in R, L, C, or $g_m$. With reference to FIG. 6(A), the signal source 10 is used with a tank circuit 16 as in FIG. 1. The current source 18 is integrated as a differential input transconductance amplifier 70. A peak sample and hold circuit 60 is provided which samples the peak value of the output signal amplitude v(t) and provides the peak value to the differential input transconductance amplifier 70. The amplifier 70 compares the peak amplitude, $v(t)_{peak}$, to a reference voltage $v_{ref3}$ and uses the result to control the amplitude of the current provided to the tank circuit. The sample and hold circuit 60 and the amplifier 70 provide an amplitude regulator which not only holds the output voltage level approximately constant, but also further improves the start-up mechanism. The amplitude regulator controls the injected current as a function of the difference 'd' between the reference voltage $v_{ref3}$ and the peak output voltage amplitude $v(t)_{peak}$. This is illustrated in FIG. 7(A) where the injected current I is shown initially high to compensate for the low output voltage and gradually reduces as the output voltage increases to a peak value which is close to $v_{ref3}$.

Figure 6B:
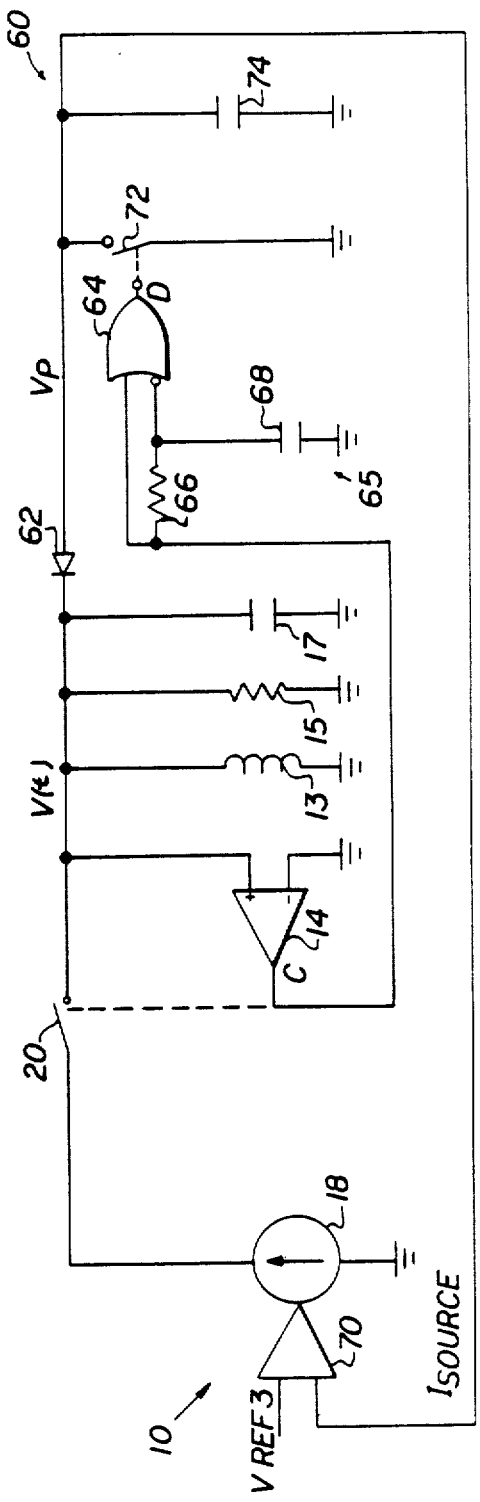
FIG. 6(B) shows the signal source of the present invention with a particular implementation of the amplitude regulation scheme of FIG. 6(A).

FIG. 6(B) shows a specific illustrative implementation of the amplitude regulation scheme of FIG. 6(A). The sample and hold circuit 60 includes a diode 62, an edge detector 65, a switch 72 and a capacitor 74. The edge detector 65 is comprised of a NOR gate 64, resistor 66 and a capacitor 68. For every negative edge of the comparator output signal, the edge detector generates a pulse which controls the switch 72, which shunts the capacitor 74.

In operation, the diode 62 is initially not conducting and $v_p$ is zero. When v(t) goes negative the comparator 14 output (point C) goes low. This places a binary zero on the first input of the NOR gate 64 and, after a delay, a binary one on the second input. The output of the NOR gate 64 is high and the switch 72 is closed for a time determined by the time constant of the RC combination of the resistor 66 and the capacitor 68. This provides a reset for the peak detecting capacitor 74. Thus, v(p) goes to zero.

When the trailing edge detector's capacitor 68 discharges sufficiently for the NOR gate output (point D) to go low, and when the differential between v(t) and v(p) equals the forward bias on the diode 62 such that it turns on, v(p) follows v(t) and, v(p), the voltage on the capacitor 74 begins to charge to the negative peak of v(t). As v(t) increases from the negative peak, the diode 62 eventually turns off and the capacitor 74 holds the last peak negative value. This value is provided to the comparator 70 for comparison to the reference value $v_{ref3}$ and use in the control of the amplitude of the current source 18. Thus, the amplitude of the current source 18 is set and ready for the next activation of the switch 20 by the comparator 14 during the next positive half cycle. When this activation occurs, the comparator output goes high and the cycle repeats with the current I from the current source 18 being equal to the transconductance $g_m$ times the difference between v(p) and $v_{ref3}$.

Those skilled in the art will recognize that both half cycles may be used to provide amplitude control. Also, unlike typical prior art schemes, the present invention provides amplitude control without using an average of the output signal. That is, as mentioned above, prior art systems typically employ an amplitude detector and a low pass filter to provide automatic gain control. Unlike the present invention, these systems do not provide amplitude regulation on a cycle-by-cycle basis. Another advantage of the present invention is the flexibility it affords in adjusting the response of the amplitude regulating process to transient conditions that would otherwise cause undesirable variations in output amplitude.

FIG. 8 shows a transconductance control circuit which provides an alternative for maintaining the output amplitude within a range suitable for active devices operating under conditions in which wide variations can be expected to occur in R, L, and C. The circuit provides a comparator 80 connected to the tank circuit 16, a voltage reference $v_{ref4}$, and a control logic section 82 connected to the output of the comparator 80 which controls a counter 84, and a multiplying digital to analog converter 86. The principal function of the circuit of FIG. 8 is to sample the amplitude of the signal across the tank circuit during a calibration interval, and automatically adjust the strength of the current pulses to a value which will ensure that the equilibrium amplitude of the signal at the conclusion of the calibration will be within a prescribed range for the actual values of L, C, and R.

In operation, at start-up, the comparator 80 compares the peak value of the output v(t) of the tank circuit 16 with the reference voltage $v_{ref4}$, where $v_{ref4}$ may be say 70% of the desired equilibrium voltage. If v(t) is greater than $v_{ref4}$, the circuit does nothing. If however, v(t) is less than $v_{ref4}$, the comparator 80, activates the control logic 82 which increments the counter 84. The value in the counter sets the output of the D/A converter 86. The D/A converter 86, in turn, controls the amplitude of the current source 18. Once again, the comparator 80 compares v(t) to $v_{ref4}$ and the cycle repeats as necessary until v(t) exceeds $v_{ref4}$. At this point, the system operates as discussed above.

Thus, the transconductance control circuit of FIG. 8 is effective to adjust the amplitude of the current source 18 at start-up to account for large variations in R, L and C. The amplitude regulator of FIG. 6 is effective to control the amplitude under equilibrium conditions to account for small variations in R, L, and C.

The present invention has been described herein with reference to illustrative alternative embodiments for particular applications. Those skilled in the art will recognize additional modifications, applications and embodiments within the scope of the invention.

It is intended by the appended claims to cover any and all such modifications, applications and embodiments. The claims are to be given the broadest scope consistent with the principles of the teachings provided herein.

Accordingly,

What is claimed is:

1. An oscillator circuit comprising:
   an inductive-capacitive tank circuit;
   control means coupled across the tank circuit for providing a control signal which is synchronous with the oscillating output signal of the tank circuit and which is indicative of the zero crossings thereof;
   switchable current source means coupled across the tank circuit and to the output of the control means for receiving the control signal and for providing current to the tank circuit which has a first value during positive half-cycles of the oscillating output signal and which has a second value during negative half-cycles thereof;
   a voltage reference source;
   a comparison circuit coupled to the output of the tank circuit and to the voltage reference source for comparing the peak amplitude of the output voltage of the tank circuit during each oscillation cycle to the reference voltage provided by said voltage reference source, and for providing as an output signal, a difference signal indicative of the difference therebetween; and
   digital control logic means coupled to the comparison circuit and to the switchable current source for receiving the difference signal provided by the comparison circuit and for adjusting the current provided by the switchable current source to the tank circuit in response thereto.

2. A regulator circuit for adjusting the current applied to an inductive-capacitive tank circuit from a current source coupled across said tank circuit, said regulator circuit comprising:
   a voltage reference source;

a peak detector circuit coupled to the output of the tank circuit and to the voltage reference source for comparing the peak amplitude of the output voltage of the tank circuit during each oscillation cycle to the reference voltage provided by said voltage reference source and for providing an output signal indicative of the difference therebetween; and digital control logic means coupled to the peak detector and to the current source for responding to the difference signal provided by the peak detector circuit and for adjusting the current provided by the current source to the tank circuit.

3. A regulator circuit for use with an inductive-capacitive tank circuit having a switchable current source coupled thereto which provides current to said tank circuit, said regulator circuit comprising:

a voltage reference source;

a comparison circuit coupled to the output of the tank circuit and to the voltage reference source for comparing the peak amplitude of the output voltage of the tank circuit during each oscillation cycle to the reference voltage provided by said voltage reference source, and for providing as an output signal, a difference signal indicative of the difference therebetween; and digital control logic means coupled to the comparison circuit and to the switchable current source for receiving the difference signal provided by the comparison circuit and for adjusting the current provided by the switchable current source to the tank circuit in response thereto.

4. An oscillator circuit comprising:

an inductive-capacitive tank circuit;

control means coupled across the tank circuit for providing a control signal which is synchronous with the oscillating output signal of the tank circuit and which is indicative of the zero crossings thereof;

a switchable current source coupled across the tank circuit and to the output of the control means for receiving the control signal and for providing current to the tank circuit which has a first value during positive half-cycles of the oscillating output signal and which has a second value during negative half-cycles thereof;

logic circuit means coupled to the switchable current source and to the output of the control means for providing predetermined voltages thereto for initiating start-up of oscillation in the oscillator circuit;

a voltage reference source;

a comparison circuit coupled to the output of the tank circuit and to the voltage reference source for comparing the peak amplitude of the output voltage of the tank circuit during each oscillation cycle to the reference voltage provided by said voltage reference source, and for providing as an output signal, a difference signal indicative of the difference therebetween; and digital control logic means coupled to the comparison circuit and to the switchable current source for receiving the difference signal provided by the comparison circuit and for adjusting the current provided by the switchable current source to the tank circuit in response thereto.

5. The oscillator circuit of claim 4 which further comprises:

voltage regulator means coupled across the tank circuit and to the reference voltage source and the switchable current source for sensing the difference between a peak voltage level of the oscillating output signal and a predetermined reference voltage level provided by the reference voltage source during each half-cycle and for adjusting first and second current values of the switchable current source means based upon signals derived from the previous half-cycles of the output of the tank circuit.

6. A signal source for use with an inductive-capacitive tank circuit comprising:

switchable current source means for selectively providing an electrical signal to said tank circuit to cause said tank circuit to provide an oscillating output signal;

comparator means connected to said tank circuit to feed back a control signal to said switchable current source means effective to switch said current source means in response to said output signal, and start up control means including a latch having first and second inputs and an output, said first input being connected to an oscillator enable signal source and said second input being connected to the output of said comparator means.

7. The signal source of claim 6 wherein said latch includes first and second cross coupled NAND gates, said first input to said latch being one input of said first NAND gate and the output of said second NAND gate being the second input to said first NAND gate; the first input to said second NAND gate being the output of said first NAND gate and the second input to said second NAND gate being an inverting input and being said second input to said latch.

8. The signal source of claim 6 wherein said start-up control means includes an OR gate having a first input connected to the output of said latch and a second input connected to the output of said comparator.

9. The signal source of claim 8 wherein said start-up control circuit includes an AND gate having a first input connected to said enable signal source and a second input connected to the output of said OR gate, the output of said AND gate being the output of said start-up control circuit and providing the control signal for said switchable current source.

10. The signal source of claim 9, herein said start-up control circuit includes means, connected to the output of said latch, for providing a reference signal at one input of said comparator.

11. A signal source for use with an inductive-capacitive tank circuit comprising:

switchable current source means for selectively providing an electrical signal to said tank circuit to cause said tank circuit to provide an oscillating output signal;

comparator means connected to said tank circuit to feed back a control signal to said switchable current source means effective to switch said current source means in response to said output signal;

a second comparator having an output connected to said switchable current source means for controlling the amplitude of said oscillating output signal, and having a first input connected to a reference voltage;

sample and hold means including a diode connected between said tank circuit and a second input of said second comparator and a second capacitor connected between said second input of said second comparator and a source of ground potential; and resetting means including means for detecting a trailing edge of the signal output by said first comparator and an electronic switch responsive to said edge detecting means and connected in parallel with said second capacitor.

* * * * *